(12) United States Patent
Kuwazawa

(10) Patent No.: US 6,528,897 B2
(45) Date of Patent: Mar. 4, 2003

(54) SEMICONDUCTOR MEMORY DEVICE

(75) Inventor: Kazunobu Kuwazawa, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/995,574

(22) Filed: Nov. 29, 2001

(65) Prior Publication Data

US 2002/0079515 A1 Jun. 27, 2002

(30) Foreign Application Priority Data

Nov. 29, 2000 (JP) ......................................... 2000-363207

(51) Int. Cl.⁷ .......................... H01L 27/10; H01L 29/73; H01L 29/76; H01L 29/94; H01L 31/062; H01L 31/113; H01L 31/119; H01L 27/11

(52) U.S. Cl. ...................... 257/903; 257/391; 257/392; 257/204

(58) Field of Search ................................ 257/204, 369, 257/371, 376, 391, 392, 393, 903, 904; 365/154, 156

(56) References Cited

FOREIGN PATENT DOCUMENTS

| JP | 07-022521 | 1/1995 |
| JP | 08-148582 | 6/1996 |
| JP | 08-316338 | 11/1996 |
| JP | 09-017962 | 1/1997 |

OTHER PUBLICATIONS

Pater Van Zant, Microchip Fabrication, 2000, Mc Graw–Hill Companies, Fourth Edition, p. 74.*

* cited by examiner

*Primary Examiner*—Nathan J. Flynn
*Assistant Examiner*—Victor A. Mandala, Jr.
(74) *Attorney, Agent, or Firm*—Konrad Raynes Victor & Mann, LLP; Alan S. Raynes

(57) ABSTRACT

A semiconductor memory device may be formed from a pair of transfer MOS transistors 1, 2 controlled by a word line 11 and a pair of data retaining flip-flop circuit formed from serially connected load elements 5, 6 and drive MOS transistors 3, 4. In the semiconductor memory device, the transfer MOS transistors 1, 2 have a threshold voltage greater than a threshold voltage of the drive MOS transistors 3, 4. The memory device may display an improved β ratio, and reduce the size of the drive MOS transistors to thereby reduce the cell area.

14 Claims, 2 Drawing Sheets

SEMICONDUCTOR MEMORY DEVICE

Applicant hereby incorporates by reference Japanese Application No. 2000-363207, filed Nov. 29, 2000, in its entirety.

TECHNICAL FIELD

The present invention relates to semiconductor memory devices, including an SRAM (static random access memory) with an improved β ratio.

RELATED ART

A conventional SRAM often uses a CMOS cell that uses six transistors, as it has a large operation margin and a small data retaining current.

In order to stabilize the operation of the SRAM, the β ratio between the drive MOS transistor and the transfer MOS transistor needs to be made large. For this purpose, these transistors are conventionally made in different sizes on their designs to secure a sufficient β ratio. For example, as a measure to increase the β ratio, sizes (gate width/gate length) of transfer MOS transistor and drive MOS transistor are changed. More specifically, when gate width/gate length of a transfer MOS transistor are respectively 0.18/0.18, gate width/gate length of a drive MOS transistor are respectively 0.22/0.12, to thereby increase the β ratio.

It is noted that the aforementioned β is a parameter that is defined by $\beta = \mu \, C_{ox} W_{eff}/L_{eff}$, where $\mu$ is carrier mobility, $C_{ox}$ is a capacitance of gate oxide film, $W_{eff}$ is an effective channel width, and $L_{eff}$ is an effective channel length. The β ratio is defined by (the capability of a drive MOS transistor)/(the capability of a transfer MOS transistor).

SUMMARY

Embodiments relate to a semiconductor memory device including a pair of transfer MOS transistors controlled by a word line and a pair of data retaining flip-flop circuits formed from serially connected load elements and drive MOS transistors, wherein the transfer MOS transistors each has a threshold voltage greater than a threshold voltage of each of the drive MOS transistors.

Embodiments also relate to a semiconductor memory device including a pair of transfer MOS transistors controlled by a word line and a pair of data retaining flip-flop circuits formed from serially connected load elements and drive MOS transistors, wherein a gate electrode of each of the transfer MOS transistors has an impurity concentration lower than an impurity concentration of a gate electrode of each of the drive MOS transistors.

Embodiments also relate to a semiconductor device including an SRAM. The device includes a first transistor including a gate electrode connected to a word line, the first transistor also including a first end connected to a first bit line. The device also includes a second transistor including a gate electrode connected to the word line, the second transistor also including a first end connected to a second bit line. The device also includes a third transistor including a gate electrode, the third transistor including a first end connected to a ground potential and a second end connected to a second end of the first transistor. The device also includes a fourth transistor including a gate electrode, the fourth transistor including a first end connected to the ground potential and a second end connected to a second end of the second transistor. The device also includes a fifth transistor including a gate electrode, the fifth transistor including a first end connected to a power supply and a second end connected to the second end of the first transistor. The device also includes a sixth transistor including a gate electrode, the sixth transistor including a first end connected to the power supply and a second end connected to the second end of the second transistor. The gate electrode of the third transistor and the gate electrode of the fifth transistor are each connected to the second end of the second transistor. The gate electrode of the fourth transistor and the gate electrode of the sixth transistor are each connected to the second end of the first transistor. In addition, the first and second transistors have a threshold voltage that is greater than a threshold voltage of the third and fourth transistors.

Embodiments also relate to a method for forming a semiconductor device including forming a pair of transfer MOS transistors controlled by a word line, and forming a pair of data retaining flip-flop circuits from serially connected load elements and drive MOS transistors. The method includes forming the transfer MOS transistors to have a threshold voltage greater than that of the drive MOS transistors.

Embodiments also relate to a method for forming a semiconductor device including forming a pair of transfer MOS transistors controlled by a word line, and forming a pair of data retaining flip-flop circuits from serially connected load elements and drive MOS transistors. The method includes forming a gate electrode of each of the transfer MOS transistors to have a lower impurity concentration than that of a gate electrode of each of the drive MOS transistors.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
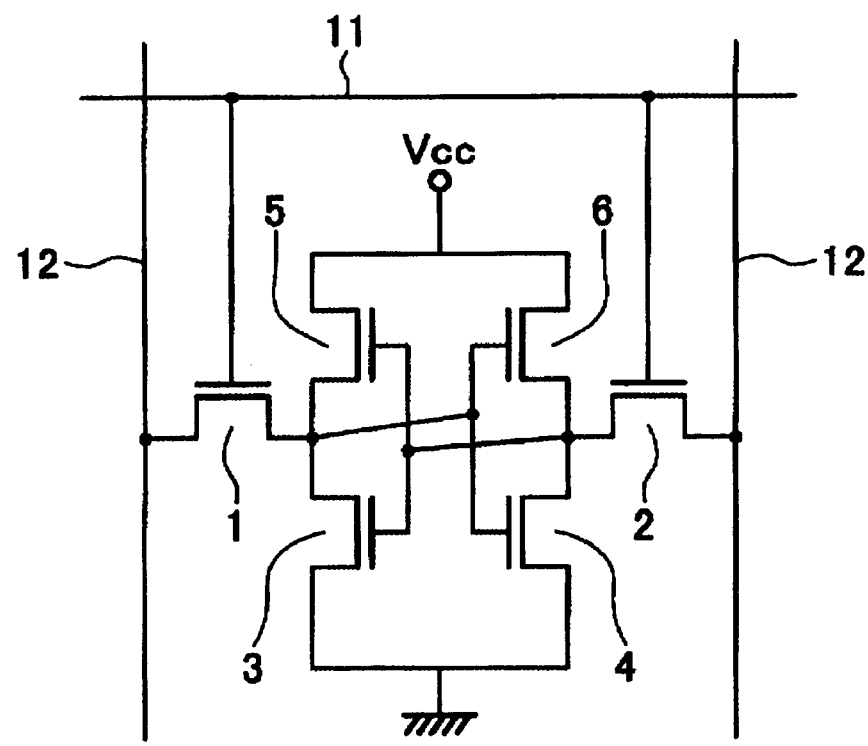
FIG. 1 shows a circuit diagram of a SRAM as an example of a semiconductor memory device in accordance with an embodiment of the present invention.

In the measures in which the β ratio is increased by changing the gate width/gate lengths of transistors as described in the related art section above, the gate width/gate length of drive MOS transistors may become larger in size than a desired process limit, because the gate width/gate length of transfer MOS transistors are determined by the process limit that is attributable the process and device characteristics. As a result, the cell area of the SRAM becomes large.

Preferred embodiments of the present invention have been made in view of the problems described above, and it is an object of preferred embodiments of the present invention to provide a semiconductor memory device that can reduce the cell area by improving the β ratio and reducing the size of drive MOS transistors.

A semiconductor memory device in accordance with a preferred embodiment of the present invention comprises: a pair of transfer MOS transistors controlled by a word line and a pair of data retaining flip-flop circuits formed from serially connected load elements and drive MOS transistors, wherein the transfer MOS transistor has a threshold voltage greater than a threshold voltage of the drive MOS transistor.

According to the above-described semiconductor memory device, the threshold voltage of the transfer MOS transistor may be made greater than that of the drive MOS transistor, such that the β ratio, which is a ratio between the capability of the drive MOS transistor and the capability of the transfer MOS transistor, can be increased. Furthermore, since the size of the drive MOS transistor can be reduced, the cell area can be reduced.

Also, in the above-described semiconductor memory device, a channel region of the transfer MOS transistor may have an impurity concentration higher than an impurity concentration of a channel region of the drive MOS transistor.

Also, in the above-described semiconductor memory device, Ge (germanium) may be introduced in a gate electrode of the transfer MOS transistor. As a result, the work function of the transfer MOS transistor can be increased, whereby the threshold voltage of the transfer MOS transistor can be made greater than the threshold voltage of the drive MOS transistor. Accordingly, the β ratio can be improved, and the size of the drive MOS transistor can be reduced to thereby reduce the cell area.

A semiconductor memory device such as that described above may be pertinent to a semiconductor memory device comprising a pair of transfer MOS transistors controlled by a word line and a pair of data retaining flip-flop circuits formed from serially connected load elements and drive MOS transistors, wherein a gate electrode of the transfer MOS transistor has an impurity concentration lower than an impurity concentration of a gate electrode of the drive MOS transistor.

By a semiconductor memory device in accordance with preferred embodiments of the present invention, the impurity concentrations of the gate electrodes may be adjusted such that depletion is more prone to occur in the gate electrode of the transfer MOS transistor compared to the gate electrode of the drive MOS transistor. As a result, the capacity between the gate electrode of the transfer MOS transistor and the silicon substrate is reduced, and the capability of the transfer MOS transistor is lowered. Accordingly, the β ratio can be improved, and the cell area of the SRAM can be reduce.

Also, in a semiconductor memory device in accordance with embodiment of the present invention, a channel region of the transfer MOS transistor may have an impurity concentration that is generally the same as that of a channel region of the drive MOS transistor. By this, the threshold voltage of the transfer MOS transistor can be increased, and therefore the capability of the transfer MOS transistor can be lowered, and as a result, the β ratio can be improved.

Certain preferred embodiments of the present invention are described below with reference to the accompanying drawings. FIG. 1 shows a circuit diagram of a SRAM as an example of a semiconductor memory device.

The SRAM is a CMOS type cell using six transistors, which is formed from a pair of transfer MOS transistors 1 and 2 that are controlled by a word line 11, and a pair of data retaining flip-flop circuits formed from serially connected load elements that are transistors 5 and 6 and drive MOS transistors 3 and 4.

Namely, the gate electrodes of the respective transfer MOS transistors 1 and 2 are connected to the word line 11, and one end of each of the transfer MOS transistors 1 and 2 is connected to one of the bit lines 12. Also, the other end of the transfer MOS transistor 1 is connected to one end of the drive MOS transistor 3, one end of the transistor 5, the gate electrode of the drive MOS transistor 4 and the gate electrode of the transistor 6. The other end of the transfer MOS transistor 2 is connected to one end of the drive MOS transistor 4, one end of the transistor 6, the gate electrode of the drive MOS transistor 3 and the gate electrode of the transistor 5. Also, the other ends of the transistors 5 and 6 are connected to power supply Vcc, and the other ends of the drive MOS transistors 3 and 4 are connected to ground potential, as illustrated in FIG. 1.

The SRAM that is a semiconductor memory device in accordance with the first illustrated embodiment is a CMOS type cell using six transistors, which is equipped with the transfer MOS transistors 1 and 2 having a threshold voltage greater than a threshold voltage of the drive MOS transistors 3 and 4. By this, the β ratio, which is a ratio between the capability of the drive MOS transistor and the capability of the transfer MOS transistor, can be increased.

It is noted that, in the example of a SRAM in which the power supply voltage is 1.8 V–2.5 V, the threshold voltage of the transfer MOS transistors 1 and 2 may preferably be set at 0.75 V–0.95 V, and the threshold voltage of the drive MOS transistors 3 and 4 may preferably be set, for example, at 0.6–0.8 V.

Next, a specific method to increase the threshold voltage of the transfer MOS transistors 1 and 2 greater than the threshold voltage of the drive MOS transistors 3 and 4 is described.

The dose of impurity ion to be ion-implanted in the channel regions of the transfer MOS transistors 1 and 2 is made greater than the dose of impurity ion to be ion-implanted in the channel regions of the drive MOS transistors 3 and 4. Since the threshold voltage of the transfer MOS transistors 1 and 2 is made higher by using the method described above, the β ratio can be improved, and the size of the drive MOS transistors can be reduced to a desired process limitation, such that the cell area of the SRAM can be reduced.

It is noted that ion implantation conditions for the channel regions of the transfer MOS transistors 1 and 2 may be set as follows. For example, when the gate electrode is composed of polysilicon and the gate dielectric film is a silicon oxide film having a thickness of about 4.5 nm, the ion implantation condition may preferably be set such that a P-type impurity concentration generally becomes about $4 \times 10^{17}$ cm$^{-3}$. Also, ion implantation conditions for the channel regions of the drive MOS transistors 3 and 4 may preferably be set such that the same generally becomes about $3 \times 10^{17}$ cm$^{-3}$.

Figure 2:
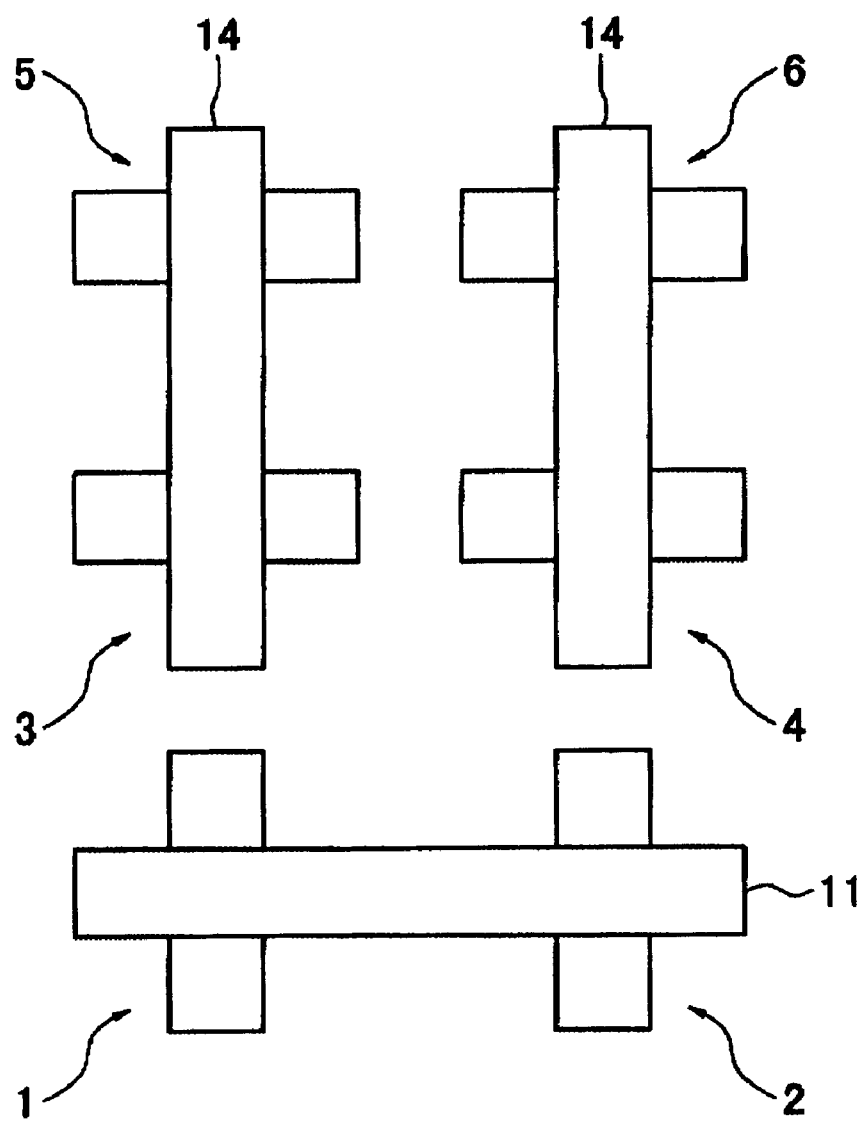
FIG. 2 shows a plan view of a semiconductor memory device in accordance with an embodiment of the present invention.

FIG. 2 shows a plan view of a semiconductor memory device in accordance with a second illustrated embodiment of the present invention. The semiconductor memory device is a SRAM formed from a CMOS cell using six transistors, which is formed from transfer MOS transistors 1 and 2, drive MOS transistors 3 and 4 and transistors 5 and 6 as load elements.

In this SRAM, Ge is introduced in the gate electrode 11 of the transfer MOS transistors 1 and 2. By this, the work function of the transfer MOS transistors can be increased, and as a result, the threshold voltage of the transfer MOS transistors can be made greater than the threshold voltage of the drive MOS transistors. As a consequence, the β ratio, which is a ratio between the capability of the drive MOS transistor and the capability of the transfer MOS transistor, can be increased, and the size of the drive MOS transistors can be reduced to a desired process limitation, such that the cell area of the SRAM can be reduced.

Next, a specific method to introduce Ge in the gate electrode 11 of the transfer MOS transistors 1 and 2 is described.

A polysilicon film is deposited on the entire surface including the gate oxide film by a CVD (chemical vapor deposition) method, and a resist film is provided on the polysilicon film.

Then, Ge is ion-implanted in the polysilicon film, using the resist film as a mask. The ion implantation condition in this instance may preferably be set as follows. For example, when the gate electrode is composed of polysilicon having a thickness of 200 nm, an acceleration voltage of 180 Kev, and a dose of $1 \times 10^{16}$ cm$^{-2}$ to $1 \times 10^{17}$ cm$^{-2}$ may preferably be used. As a result, Ge is introduced in the polysilicon film in regions where the transfer MOS transistors 1 and 2 are to be formed, and the Ge concentration in these regions is about 20%–50% to the silicon.

Then, the polysilicon film is patterned, whereby the gate electrodes 11 and 14 for the transfer MOS transistors 1 and 2, the drive MOS transistors 3 and 4, and the transistors 5 and 6 are formed.

The SRAM that is a semiconductor memory device in accordance with the second illustrated embodiment is a CMOS type cell using six transistors, which is equipped with the transfer MOS transistors 1 and 2 having the gate electrode with an impurity concentration lower than the impurity concentration of the gate electrodes of the drive MOS transistors 3 and 4. In this manner, the impurity concentrations of the gate electrodes may be adjusted by changing the amount of impurities that are introduced in the gate electrodes, such that depletion is more prone to occur in the gate electrode of the transfer MOS transistors compared to the gate electrode of the drive MOS transistors. As a result, the capacity between the gate electrode of the transfer MOS transistor and the silicon substrate is reduced, and the capability of the transfer MOS transistor is lowered. Accordingly, the β ratio can be improved, and the size of the drive MOS transistor can be reduced to a desired process limitation, such that the cell area of the SRAM can be reduced.

It is noted that the impurity concentration for the gate electrode of the transfer MOS transistor may preferably be about $1 \times 10^{19}$ cm$^{-3}$ to $5 \times 10^{19}$ cm$^{-3}$. Also, the impurity concentration for the gate electrode of the drive MOS transistor may preferably be about $1 \times 10^{20}$ cm$^{-3}$ to $6 \times 10^{20}$ cm$^{-3}$.

In the case of this SRAM embodiment, the impurity concentration of the channel region of the transfer MOS transistor may preferably be the same as that of the channel region of the drive MOS transistor. As a result, the threshold voltage of the transfer MOS transistor can be increased, and therefore the capability of the transfer MOS transistor can be lowered, such that the β ratio can be made greater.

It is noted that an ion implantation may be conducted one time to introduce ions in the channel regions of the transfer MOS transistors and the channel regions of the drive MOS transistors such that the impurity concentrations in both of the channel regions can be made approximately the same with respect to one another.

It is noted that the present invention is not limited to the embodiments described above, and can be modified and implemented in a variety of manners.

As described above, in the preferred embodiments of the present invention, the threshold voltage of transfer MOS transistors is made greater than that of drive MOS transistors. As a result, there can be provided a semiconductor memory device that can reduce the cell area by improving the β ratio, and reducing the size of the drive MOS transistor.

What is claimed:

1. A semiconductor memory device comprising a pair of transfer MOS transistors controlled by a word line and a pair of data retaining flip-flop circuits formed from serially connected load elements and drive MOS transistors, wherein the transfer MOS transistors each has a threshold voltage greater than a threshold voltage of each of the drive MOS transistors.

2. A semiconductor memory device according to claim 1, wherein a channel region of each of the transfer MOS transistors has an impurity concentration higher than an impurity concentration of a channel region of each of the drive MOS transistors.

3. A semiconductor memory device according to claim 1, wherein Ge is introduced in a gate electrode of the transfer MOS transistors.

4. A semiconductor memory device comprising a pair of transfer MOS transistors controlled by a word line and a pair of data retaining flip-flop circuits formed from serially connected load elements and drive MOS transistors, wherein a gate electrode of each of the transfer MOS transistors has an impurity concentration lower than an impurity concentration of a gate electrode of each of the drive MOS transistors.

5. A semiconductor memory device according to claim 4, wherein a channel region of the transfer MOS transistor has an impurity concentration that is approximately the same as that of a channel region of the drive MOS transistor.

6. A semiconductor device including an SRAM, comprising:
   a first transistor including a gate electrode connected to a word line, the first transistor also including a first end connected to a first bit line;
   a second transistor including a gate electrode connected to the word line, the second transistor also including a first end connected to a second bit line;
   a third transistor including a gate electrode, the third transistor including a first end connected to a ground potential and a second end connected to a second end of the first transistor;
   a fourth transistor including a gate electrode, the fourth transistor including a first end connected to the ground potential and a second end connected to a second end of the second transistor;
   a fifth transistor including a gate electrode, the fifth transistor including a first end connected to a power supply and a second end connected to the second end of the first transistor;
   a sixth transistor including a gate electrode, the sixth transistor including a first end connected to the power supply and a second end connected to the second end of the second transistor;
   wherein the gate electrode of the third transistor and the gate electrode of the fifth transistor are each connected to the second end of the second transistor;
   wherein the gate electrode of the fourth transistor and the gate electrode of the sixth transistor are each connected to the second end of the first transistor; and
   wherein the first and second transistors have a threshold voltage that is greater than a threshold voltage of the third and fourth transistors.

7. A semiconductor device as in claim 6, wherein the device includes:
   a power supply voltage in the range of 1.8 V to 2.5 V;

a threshold voltage in the range of 0.75 V to 0.95 V for the first and second transistors; and a threshold voltage in the range of 0.6 V to 0.8 V for the third and fourth transistors.

8. A semiconductor device as in claim 6, wherein:

the first and second transistors each include a channel region having an impurity ion implanted therein;

the third and fourth transistors each include a channel region having an impurity implanted therein; and wherein a dose of the impurity ion implanted into the channel regions of the first and second transistors is greater than that implanted into the channel regions of the third and fourth transistors.

9. A semiconductor device as in claim 8, wherein the gate electrode for each of the first, second, third and fourth transistors comprises polysilicon and each of the first, second, third and fourth transistors includes a gate dielectric layer comprising silicon oxide having a thickness of approximately 4.5 nm; and wherein a P-type impurity concentration for the channel regions of the first and second transistors is approximately $4 \times 10^{17}$ cm$^{-3}$, and a P-type impurity concentration for the channel regions of the third and fourth transistors is approximately $3 \times 10^{17}$ cm$^{-3}$.

10. A semiconductor device as in claim 6, wherein the first and second transistor gate electrodes each comprise polysilicon and germanium.

11. A semiconductor device as in claim 10, wherein the first and second transistor gate electrodes each comprise polysilicon with germanium implanted therein, wherein the germanium concentration is 20 to 50 percent than of the silicon.

12. A semiconductor device as in claim 6, wherein the first and second transistor gate electrodes each include an impurity concentration that is less than that of the third and fourth transistor gate electrodes.

13. A semiconductor device as in claim 12, wherein the impurity concentration of the first and second transistor gate electrodes is in the range of $1 \times 10^{19}$ cm$^{-3}$ to $5 \times 10^{19}$ cm$^{-3}$, and the impurity concentration of the third and fourth transistor gate electrodes is in the range of $1 \times 10^{20}$ cm$^{-3}$ to $6 \times 10^{20}$ cm$^{-3}$.

14. A semiconductor device as in claim 12, wherein:

the first and second transistors each include a channel region having an impurity ion implanted therein;

the third and fourth transistors each include a channel region having an impurity implanted therein; and wherein an impurity concentration in the channel regions of the first and second transistors is approximately the same as an impurity concentration of the channel regions of the third and fourth transistors.

\* \* \* \* \*